(12) United States Patent
Kim et al.

(10) Patent No.: US 7,338,849 B2
(45) Date of Patent: Mar. 4, 2008

(54) METHODS OF FABRICATING FLASH MEMORY DEVICES AND FLASH MEMORY DEVICES FABRICATED THEREBY

(75) Inventors: Dong-Chan Kim, Seoul (KR);
Chang-Jin Kang, Gyeonggi-do (KR);
Kyeong-Koo Chi, Seoul (KR);
Dong-Hyun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 165 days.

(21) Appl. No.: 11/261,820

(22) Filed: Oct. 28, 2005

(65) Prior Publication Data
US 2006/0094188 A1 May 4, 2006

(30) Foreign Application Priority Data
Oct. 29, 2004 (KR) .................. 10-2004-0087518

(51) Int. Cl.
*H01L 21/8238* (2006.01)
*H01L 29/788* (2006.01)

(52) U.S. Cl. ..................... 438/211; 257/316
(58) Field of Classification Search ........ 257/315–320, 257/E29.137–E29.138, E29.14–E29.161; 438/201, 211, 257, 593
See application file for complete search history.

(56) References Cited

U.S. PATENT DOCUMENTS 5,266,509 A * 11/1993 Chen .................. 438/261
6,037,223 A * 3/2000 Su et al. ................ 438/257
6,159,801 A 12/2000 Hsieh et al.
6,750,066 B1 6/2004 Cheung et al.
6,943,075 B2 * 9/2005 Joo ........................ 438/211
2003/0141535 A1 7/2003 Jang

FOREIGN PATENT DOCUMENTS

KR 100213199 B1 5/1999
KR 10-2003-0065702 A 8/2003

OTHER PUBLICATIONS

Office Action corresponding to Korean Application No. 10-2004-0087518 dated Jan. 31, 2006.

* cited by examiner

*Primary Examiner*—Calvin Lee
(74) *Attorney, Agent, or Firm*—Myers Bigel Sibley & Sajovec, PA (57) ABSTRACT

Methods of fabricating a flash memory device and flash memory devices fabricated thereby are provided. One of the methods includes forming an isolation layer in a semiconductor substrate to define a plurality of parallel active regions in the semiconductor substrate. A plurality of first conductive layer patterns are formed on the active regions. The first conductive layer patterns are spaced apart from each other in a lengthwise direction of the active regions. An insulating layer is conformally formed on the semiconductor substrate and the first conductive layer patterns. A second conductive layer is formed on the insulating layer. The second conductive layer is patterned until the insulating layer is exposed to form a plurality of parallel second conductive layer patterns. The second conductive layer patterns cross the active regions and the isolation layer to overlap the first conductive layer patterns.

32 Claims, 7 Drawing Sheets

METHODS OF FABRICATING FLASH MEMORY DEVICES AND FLASH MEMORY DEVICES FABRICATED THEREBY

CROSS-REFERENCE TO RELATED APPLICATION

This application claims the benefit of Korean Patent Application No. 10-2004-0087518, filed Oct. 29, 2004, the contents of which are hereby incorporated herein by reference in their entirety.

FIELD OF THE INVENTION

The present invention relates to methods of fabricating semiconductor devices and, more particularly, to methods of fabricating flash memory devices and devices fabricated thereby.

BACKGROUND OF THE INVENTION

Semiconductor memory devices that store data may be classified into volatile memory devices and nonvolatile memory devices. In contrast to volatile memory devices, nonvolatile memory devices, such as flash memory devices, retain stored data even if power is abruptly interrupted. For this reason, nonvolatile memory devices are widely employed in memory cards and other electronic devices such as mobile communication terminals.

Flash memory devices may be classified as NOR type and NAND type devices according to the structure of their cell arrays. NOR type flash memory devices may allow high speed random access, while NAND type flash memory devices may allow high speed programming and erasure operations and may be highly integrated. The performance of program and erase operations can depend upon the coupling ratio (CR) of their unit cells. A program operation is performed by Fowler-Nordheim (FN) tunneling or hot electron injection, and an erase operation is performed by FN tunneling. FN tunneling can occur when an electric field of 6 to 8 MV/cm is applied to a tunnel insulating layer between a floating gate electrode and a substrate of a cell. The electric field that is applied between the floating gate electrode and the substrate can be induced by applying a high voltage of 15 to 20 V to a control gate electrode that is on the floating gate electrode. Accordingly, the programming voltage or erasing voltage may be reduced by increasing the CR of the unit cell of the flash memory device. The CR may be expressed by the following Equation 1:

$$CR = \frac{Ci}{Ci + Ct}, \qquad (1)$$

where $Ci$ refers to the capacitance of an inter-gate insulating layer interposed between the floating gate electrode and the control gate electrode, and $Ct$ refers to the capacitance of the tunnel insulating layer interposed between the floating gate electrode and the substrate.

As can be seen from Equation 1, the CR may be increased by increasing the capacitance $Ci$ of the inter-gate insulating layer. A method for increasing the capacitance $Ci$ of the inter-gate insulating layer is disclosed in U.S. Patent Publication No. 2003-0141535. A high-k dielectric layer is used in place of a silicon oxide/silicon nitride/silicon oxide (ONO) layer as an inter-gate insulating layer has been proposed to increase the capacitance $Ci$ of the inter-gate insulating layer. However, using a high-k dielectric layer as the inter-gate insulating layer can necessitate changes in the fabrication process.

Figure 1A:
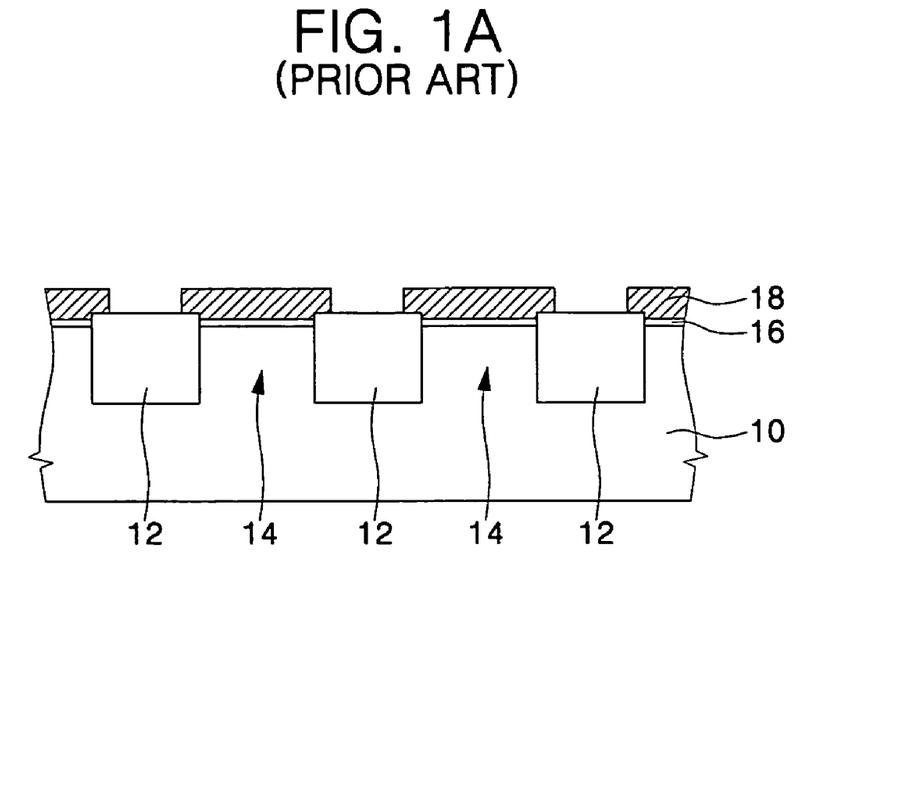
FIGS. 1A, 1B, 2A, and 2B are cross-sectional views illustrating a method of fabricating a conventional flash memory device.
Figure 1B:
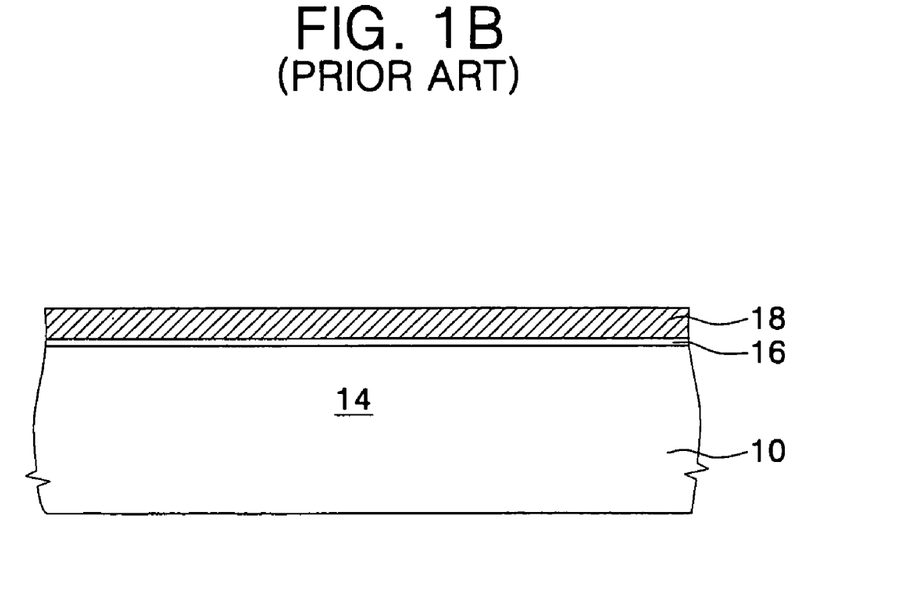
Figure 2A:
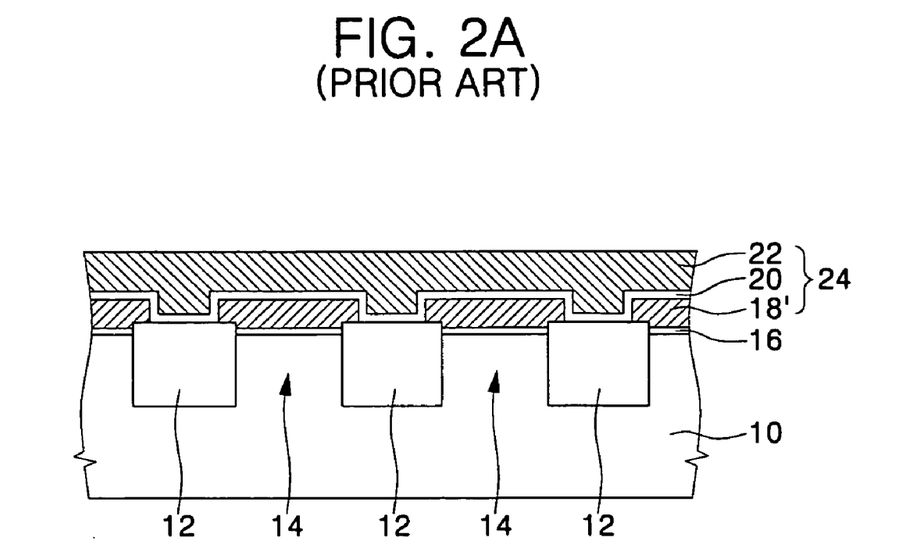
Figure 2B:
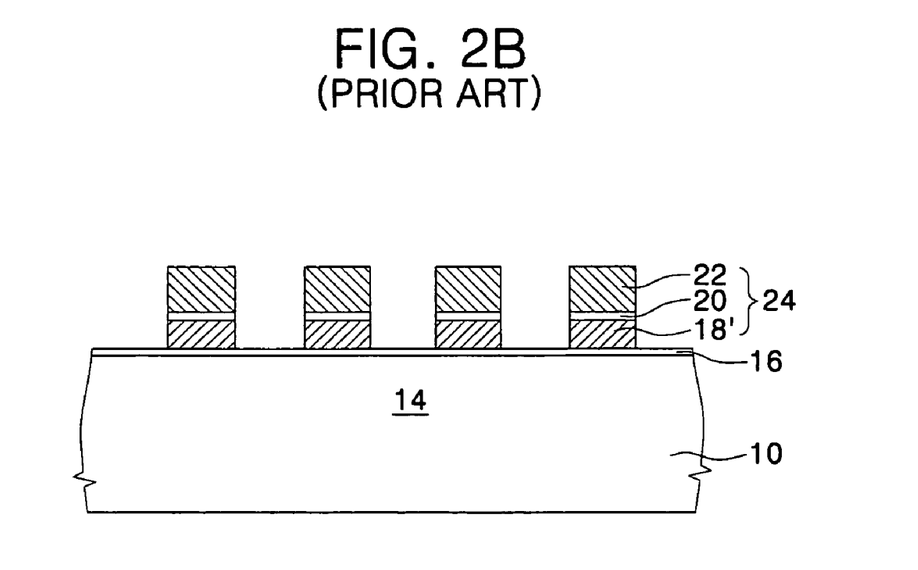

FIGS. 1A, 1B, 2A, and 2B are cross-sectional views illustrating a method of fabricating a conventional flash memory device. FIGS. 1A and 2A are cross-sectional views taken in the direction of word line patterns of the flash memory device, and FIGS. 1B and 2B are cross-sectional views taken in the direction of active regions of the flash memory device.

Referring to FIGS. 1A and 1B, an isolation layer 12 is formed in a semiconductor substrate 10 to define a plurality of active regions 14. The active regions 14 are defined as parallel lines. A tunnel insulating layer 16 is formed on the active regions 14. Thereafter, a polysilicon layer (not shown) is formed on the entire surface of the semiconductor substrate 10, including on the tunnel insulating layer 16, and patterned to form polysilicon layer patterns 18. The polysilicon layer patterns 18 are patterned as lines that cover the active regions 14 but expose the isolation layer 12.

Referring to FIGS. 2A and 2B, a high-k dielectric layer (not shown) and a control gate material layer (not shown) are formed on the semiconductor substrate 10 including on the polysilicon layer patterns 18. The high-k dielectric layer is conformally formed along sidewalls and top surfaces of the polysilicon layer patterns 18. The control gate material layer, the high-k dielectric layer, and the polysilicon layer patterns 18 are sequentially patterned to form word line patterns 24 that cross the active regions 14 and the isolation layer 12. The word line patterns 24 include floating gate electrodes 18', an inter-gate insulating layer 20, and control gate electrodes 22, which are sequentially stacked. Typically, a patterning process for forming the word line patterns 24 is performed by sequentially etching the control gate material layer, the high-k dielectric layer, and the polysilicon layer patterns 18 using photolithography and dry etching processes. The high-k dielectric layer is etched after etching the control gate material layer. In this case, a process recipe suitable for dry etching the high-k dielectric layer has not yet been established. As a result, especially in a NAND type flash memory device in which word line patterns are spaced at small intervals, it may be more difficult to etch the high-k dielectric layer.

More specifically, the high-k dielectric layer formed on the sidewalls of the polysilicon layer patterns 18 may be not completely etched but may instead remain as high-k dielectric fences. During a subsequent process of etching the polysilicon layer patterns 18, the polysilicon layer patterns 18 adjacent to the high-k dielectric fences may not be etched. As a result, electric bridges may be formed between the adjacent floating gate electrodes 18' along the active regions 14. However, if high-k dielectric layer is over-etched in an attempt to prevent formation of electric bridges, the polysilicon layer patterns 18 may be damaged when etching the high-k dielectric layer. Hence, during the subsequent process of etching the polysilicon layer patterns 18, the active regions 14 disposed under the polysilicon layer patterns 18 may experience etching damage.

SUMMARY OF THE INVENTION

Some embodiments of the invention provide methods of fabricating a flash memory device and flash memory devices in which etching a high-k dielectric layer that is used as an inter-gate insulating layer may be omitted so that problems that can arise from such etching may be avoided.

In one embodiment of the invention, a method of fabricating a flash memory device includes forming an isolation layer in a semiconductor substrate to define a plurality of parallel active regions in the semiconductor substrate. A plurality of first conductive layer patterns are formed on the active regions. The first conductive layer patterns are spaced apart from each other in a lengthwise direction of the active regions. An insulating layer is conformally formed on the semiconductor substrate and the first conductive layer patterns. A second conductive layer is formed on the insulating layer. The second conductive layer is patterned until the insulating layer is exposed to form a plurality of parallel second conductive layer patterns. The second conductive layer patterns cross the active regions and the isolation layer to overlap the first conductive layer patterns.

In some further embodiments, the first conductive layer patterns may be formed of polysilicon. Also, the first conductive layer patterns may be formed to each have a substantially square shape in a plan view. The insulating layer may be formed on an upper surface and each of the four sidewalls of the substantially square first conductive layer patterns.

In some further embodiments, the insulating layer may be formed of a high-k dielectric layer. The high-k dielectric layer may be formed of one of an aluminum oxide (AlO) layer, a hafnium oxide (HfO) layer, a hafnium silicon oxide (HfSiO) layer, a hafnium aluminum oxide (HfAlO) layer, a tantalum oxide (TaO) layer, and/or zirconium oxide (ZrO) layer, and/or stacked layers of two or more thereof.

In still further embodiments, the second conductive layer may include a polysilicon layer. The second conductive layer may be formed by sequentially stacking a polysilicon layer and a metal silicide layer.

In still further embodiments, after the first conductive layer patterns are formed, the method may further include forming source and drain regions by implanting impurity ions into the active regions using the first conductive layer patterns and the isolation layer as ion implantation masks.

In still further embodiments, after the second conductive layer patterns are formed, the method may further include forming an interlayer insulating layer to cover the second conductive layer patterns and portions of the insulating layer exposed by the second conductive layer patterns.

Another embodiment of the present invention is directed to a method of fabricating a NAND type flash memory device. The method includes forming an isolation layer in a semiconductor substrate to define a plurality of parallel active regions in the semiconductor substrate. A plurality of floating gate electrodes are formed on the active regions to be spaced apart from each other in a lengthwise direction of the active regions. An inter-gate insulating layer is conformally formed on the semiconductor substrate having the floating gate electrodes. A conductive layer is formed on the inter-gate insulating layer. A plurality of parallel control gate electrodes are formed by patterning the conductive layer until the inter-gate insulating layer is exposed. Thus, the control gate electrodes cross the active regions and the isolation layer to overlap the floating gate electrodes.

Another embodiment of the present invention is directed to a flash memory device. The device includes an isolation layer in a semiconductor substrate to define a plurality of parallel active regions. A plurality of first conductive layer patterns are on the active regions and spaced apart from each other in a lengthwise direction of the active regions. A plurality of parallel second conductive layer patterns cross the active regions and the isolation layer to overlap the first conductive layer patterns. An insulating layer is interposed between the first conductive layer patterns and the second conductive layer patterns and extends to cover at least sidewalls of the first conductive layer patterns.

In some embodiments, the first conductive layer patterns may be polysilicon layers. Also, the first conductive layer patterns may each have a substantially square shape in a plan view.

In some further embodiments, the insulating layer may be a high-k dielectric layer. The high-k dielectric layer may be one of an aluminum oxide (AlO) layer, a hafnium oxide (HfO) layer, a hafnium silicon oxide (HfSiO) layer, a hafnium aluminum oxide (HfAlO) layer, a tantalum oxide (TaO) layer, and/or zirconium oxide (ZrO) layer, and/or stacked layers of two or more thereof.

In some further embodiments, the insulating layer may further extend to cover the active regions and the isolation layer disposed between the conductive layer patterns.

In some further embodiments, the second conductive layer patterns may include polysilicon layers.

In some further embodiments, the flash memory device may further include an interlayer insulating layer disposed on the entire surface of the semiconductor substrate, the first and second conductive layer patterns, and the insulating layer.

Another embodiments of the present invention is directed to a NAND type flash memory device. The device includes an isolation layer disposed in a semiconductor substrate to define a plurality of parallel active regions. A plurality of floating gate electrodes are disposed on the active regions and spaced apart from each other in a lengthwise direction of the active regions. A plurality of parallel control gate electrodes cross the active regions and the isolation layer to overlap the floating gate electrodes. An inter-gate insulating layer is interposed between the floating gate electrodes and the control gate electrodes and extends to cover at least sidewalls of the floating gate electrodes.

BRIEF DESCRIPTION OF THE DRAWINGS

The invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION OF THE INVENTION

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another elements as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. The thickness of layers and regions are exaggerated for illustration and explanation. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
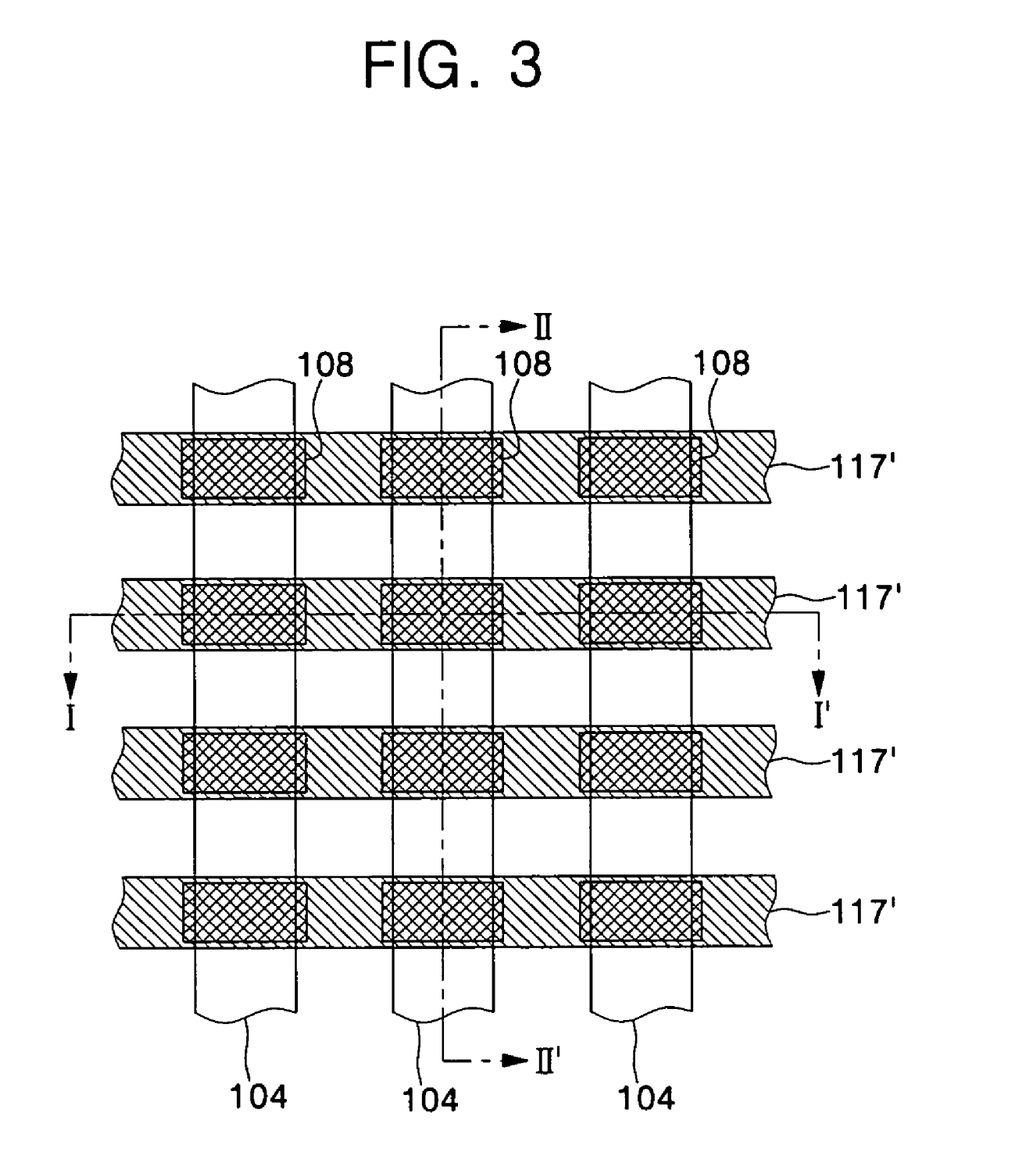
FIG. 3 is a plan view illustrating methods of fabricating a NAND type flash memory device according to some embodiments of the present invention.

FIG. 3 is a plan view illustrating methods of fabricating a NAND type flash memory device according to some embodiments of the present invention, and FIGS. 4A, 4B, 5A, 5B, 6A, 6B, 7A, and 7B are cross-sectional views illustrating methods of fabricating a NAND type flash memory device according to some more embodiments of the present invention. Specifically, FIGS. 4A, 5A, 6A, and 7A are cross-sectional views taken along line I-I' of FIG. 3, and FIGS. 4B, 5B, 6B, and 7B are cross-sectional views taken along line II-II' of FIG. 3. A NAND type flash memory device will be discussed in the following exemplary embodiments, but the present invention is not limited thereto. Instead, some embodiments of the present invention may be applied to other types of flash memory devices such as, for example, NOR type flash memory devices that include a floating gate electrode, an inter-gate insulating layer, and a control gate electrode.

Figure 4A:
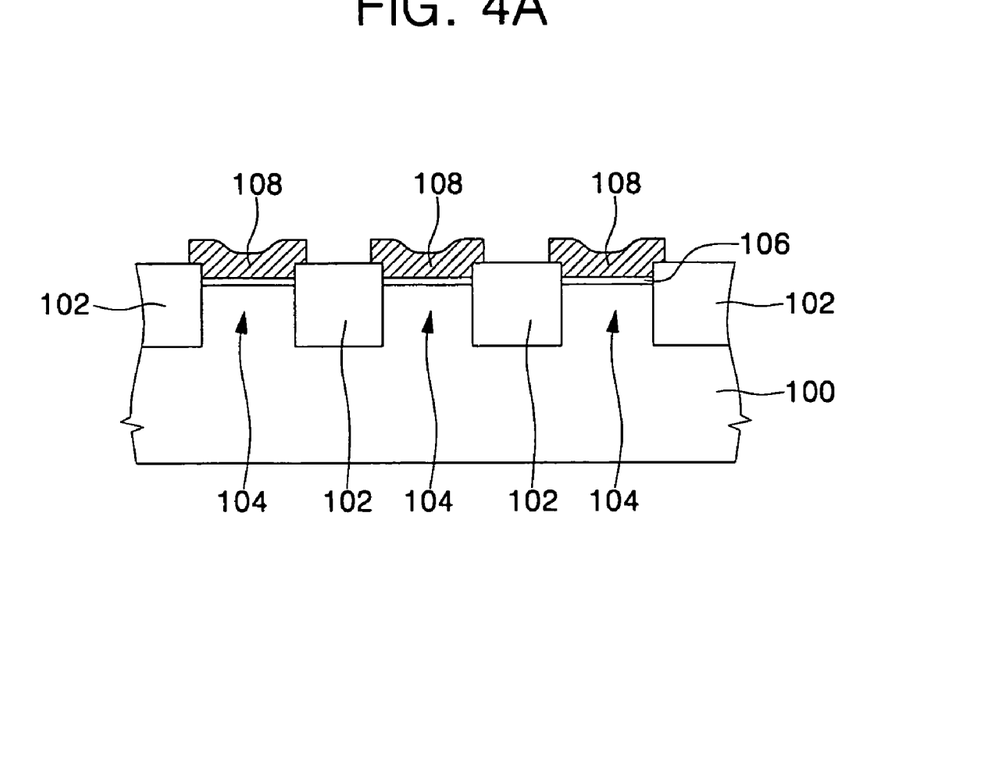
FIGS. 4A, 4B, 5A, 5B, 6A, 6B, 7A, and 7B are cross-sectional views illustrating methods of fabricating a NAND type flash memory device according to some more embodiments of the present invention.
Figure 4B:
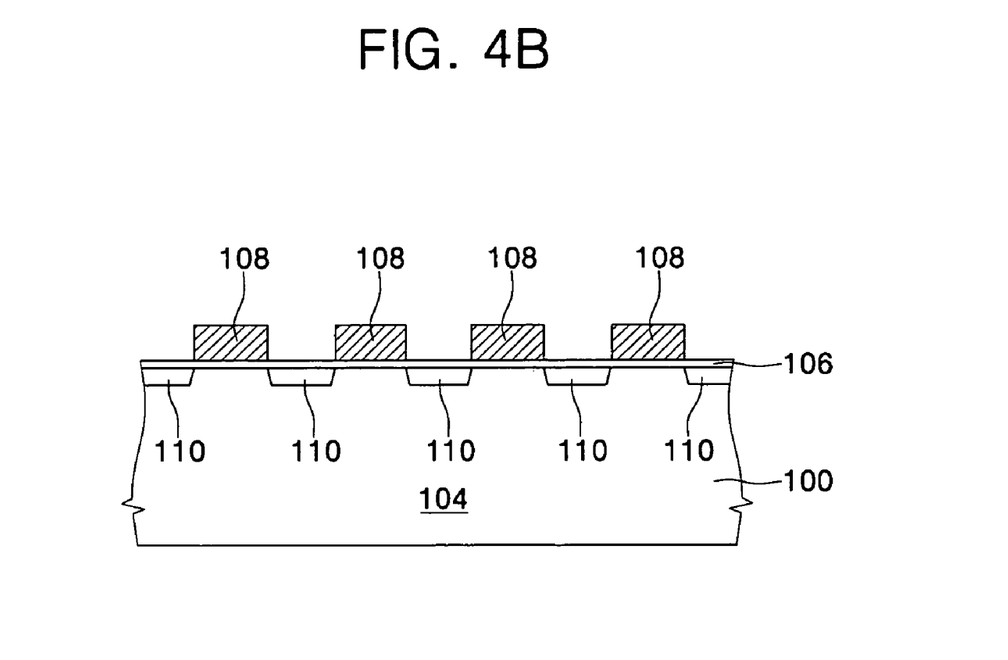

Referring to FIGS. 3, 4A, and 4B, an isolation layer 102 is formed in a semiconductor substrate 100 to define active regions 104. The semiconductor substrate 100 may be a substrate of a first conductivity type, for example, a p-type silicon substrate. The isolation layer 102 may be obtained using a conventional shallow trench isolation (STI) technique. As shown in FIG. 3, the active regions 104 may be defined to have the shape of parallel lines. A tunnel insulating layer 106 is formed on the active regions 104. The tunnel insulating layer 106 may be formed of a silicon oxide ($SiO_2$) layer, a silicon oxynitride (SiON) layer, and/or a high-k dielectric layer. The high-k dielectric layer may be an aluminum oxide (AlO) layer, a hafnium oxide (HfO) layer, a hafnium silicon oxide (HfSiO) layer, a hafnium aluminum oxide (HfAlO) layer, a tantalum oxide (TaO) layer, and/or a zirconium oxide (ZrO) layer, or stacked layers of two or more thereof.

A first conductive layer (not shown) is formed on the semiconductor substrate 100 and the tunnel insulating layer 106. The first conductive layer may be formed of polysilicon. The first conductive layer is patterned using, for example, photolithography and etching processes to form a plurality of conductive layer patterns on the active regions 104. The first conductive layer patterns serve as floating gate electrodes 108 of a NAND type flash memory device. The floating gate electrodes 108 are formed a predetermined distance apart from each other along the active regions 104 as shown in FIG. 3 and may each have a substantially square shape in the plan view. Accordingly, an upper surface of each of the floating gate electrodes 108 may have a substantially square shape. Also, the floating gate electrodes 108 are formed to have a length crossing the active regions 104, and may partially extend to cover adjacent portions of the isolation layer 102. Impurity ions of a second conductivity type such as, for example, n-type impurity ions, are implanted into the active regions 104, using the floating gate electrodes 108 and the isolation layer 102 as ion implantation masks, to form source and drain regions 110 in the active regions 104 on both sides of the floating gate electrodes 108.

Figure 5A:
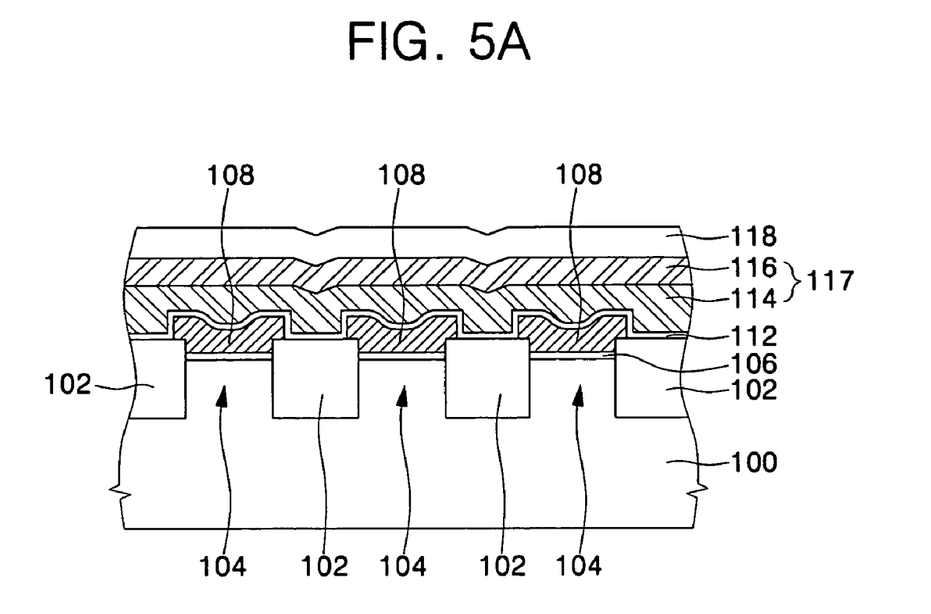
Figure 5B:
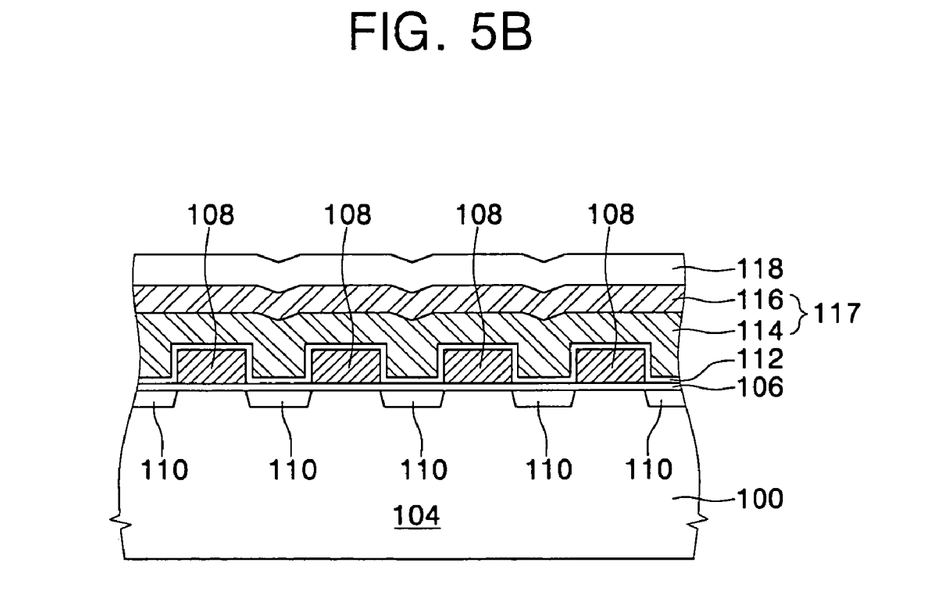

Referring to FIGS. 3, 5A, and 5B, after the source and drain regions 110 are formed, an inter-gate insulating layer 112 is conformally formed on the entire surface of the semiconductor substrate 100. Specifically, the inter-gate insulating layer 112 conformally covers top surfaces and sidewalls of the floating gate electrodes 108 and covers the active regions 104 and the isolation layer 102 disposed between the floating gate electrodes 108. When the floating gate electrodes 108 have a square shape as described above, the inter-gate insulating layer 112 may be formed to cover all the four sidewalls of each of the floating gate electrodes 108. In order to reduce programming and erasing voltages by raising the coupling ratio (CR) of a unit cell, the inter-gate insulating layer 112 may be formed of a high-k dielectric layer. The high-k dielectric layer may be formed of an aluminum oxide (AlO) layer, a hafnium oxide (HfO) layer, a hafnium silicon oxide (HfSiO) layer, a hafnium aluminum oxide (HfAlO) layer, a tantalum oxide (TaO) layer, and/or a zirconium oxide (ZrO) layer, or stacked layers of two or more thereof using, for example, a chemical vapor deposition (CVD) process and/or an atomic layer deposition (ALD) process.

Subsequently, a second conductive layer 117 and a capping layer 118 are sequentially formed on the inter-gate insulating layer 112. The second conductive layer 117 may be formed of a stacked layer of a second lower conductive layer 114 and a second upper conductive layer 116. In this case, the second lower conductive layer 114 may be a polysilicon layer, while the second upper conductive layer 116 may be a metal silicide layer, such as a tungsten silicide layer, a cobalt silicide layer, and/or a nickel silicide layer. Alternatively, the second upper conductive layer 116 may be a metal layer, such as a tungsten layer. The capping layer 118 may be formed of a silicon nitride (SiN) layer.

Figure 6A:
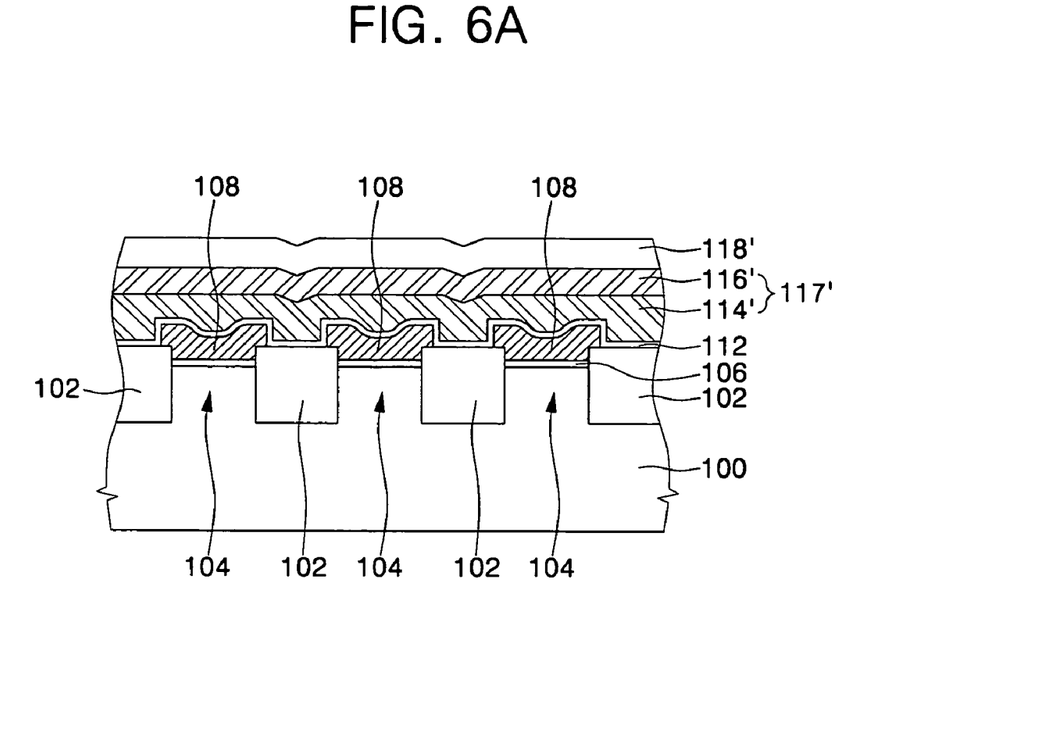
Figure 6B:
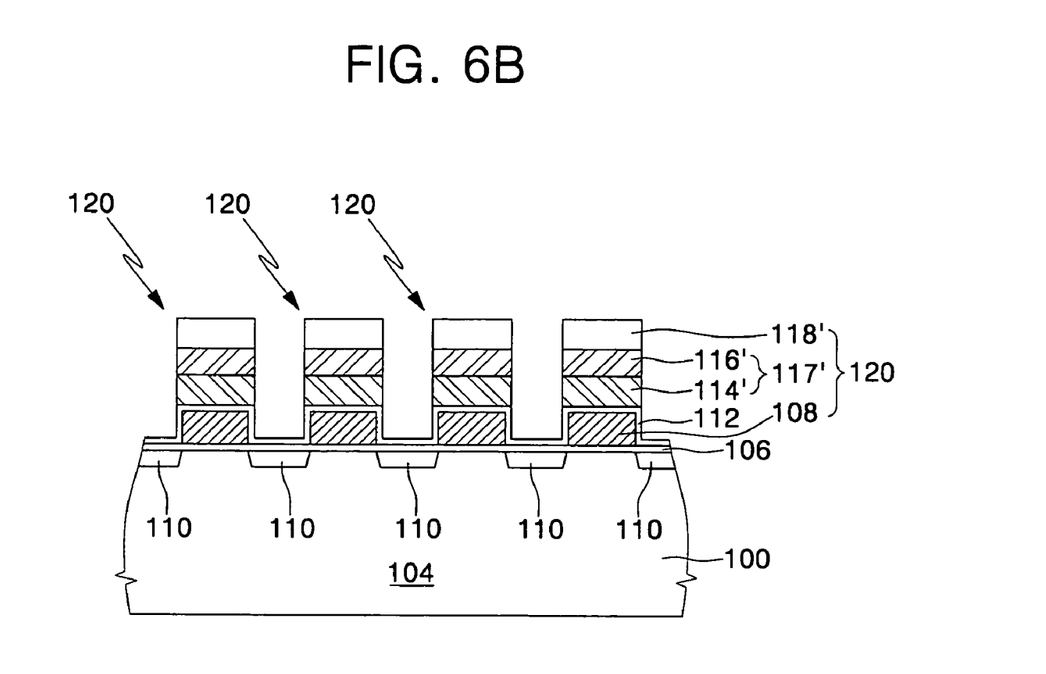

Referring to FIGS. 3, 6A, and 6B, the capping layer 118, the second upper conductive layer 116, and the second lower conductive layer 114 are sequentially patterned until the inter-gate insulating layer 112 is exposed. A plurality of second conductive layer patterns 117' and a plurality of capping layer patterns 118' are thereby formed parallel to each other. The second conductive layer patterns 117' and the capping layer patterns 118' cross the active regions 104 and the isolation layer 102 to overlap the floating gate electrodes 108. The second conductive layer patterns 117' include second lower conductive layer patterns 114' and second upper conductive layer patterns 116', which are sequentially stacked, and are provided as control gate electrodes 117' of the NAND type flash memory device. In this case, the floating gate electrodes 108, the inter-gate insulating layer 112, the control gate electrodes 117', and the capping layer patterns 118' can serve as word line patterns 120 of the NAND type flash memory device. In the NAND type flash memory device, the word line patterns 120 shown in the drawings are portions of a plurality of parallel word line patterns interposed between a string select line SSL and a ground select line GSL.

The second conductive layer 117 and the capping layer 118 may be patterned by photolithography and dry etching processes. In these processes, a portion of the inter-gate insulating layer 112, which is exposed between the word line patterns 120, functions as an etch stop layer.

According to some embodiments of the present invention, the floating gate electrodes 108 are formed before the inter-gate insulating layer 112 are formed. Accordingly, it is not necessary to etch the inter-gate insulating layer 112 during the patterning process for forming the control gate electrodes 117'. As a result, when a high-k dielectric layer is used as the inter-gate insulating layer 112, problems can be avoided that can otherwise arise from etching the high-k dielectric layer.

Figure 7A:
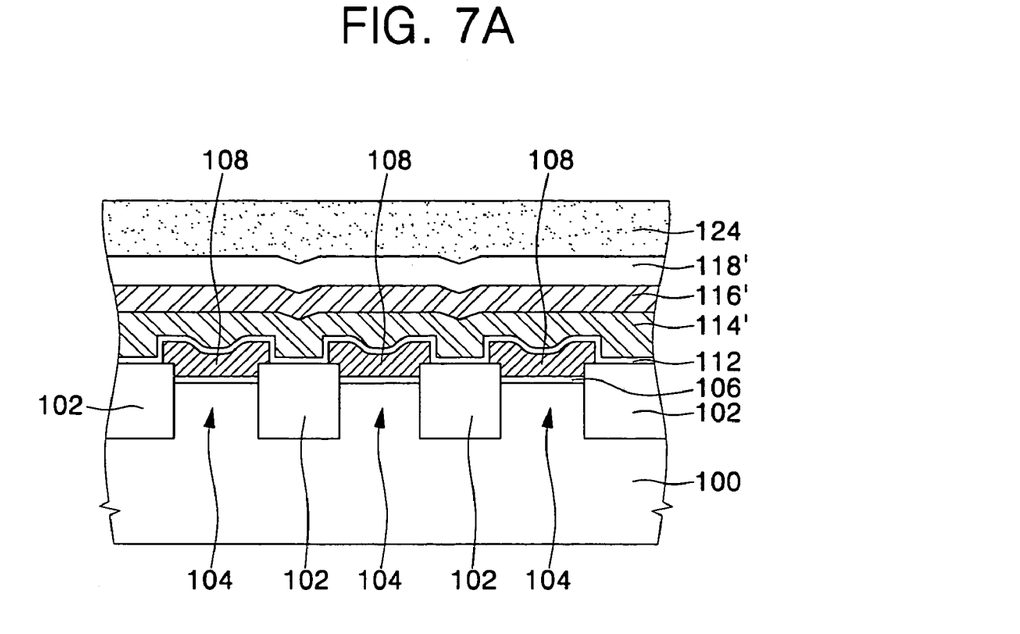
Figure 7B:
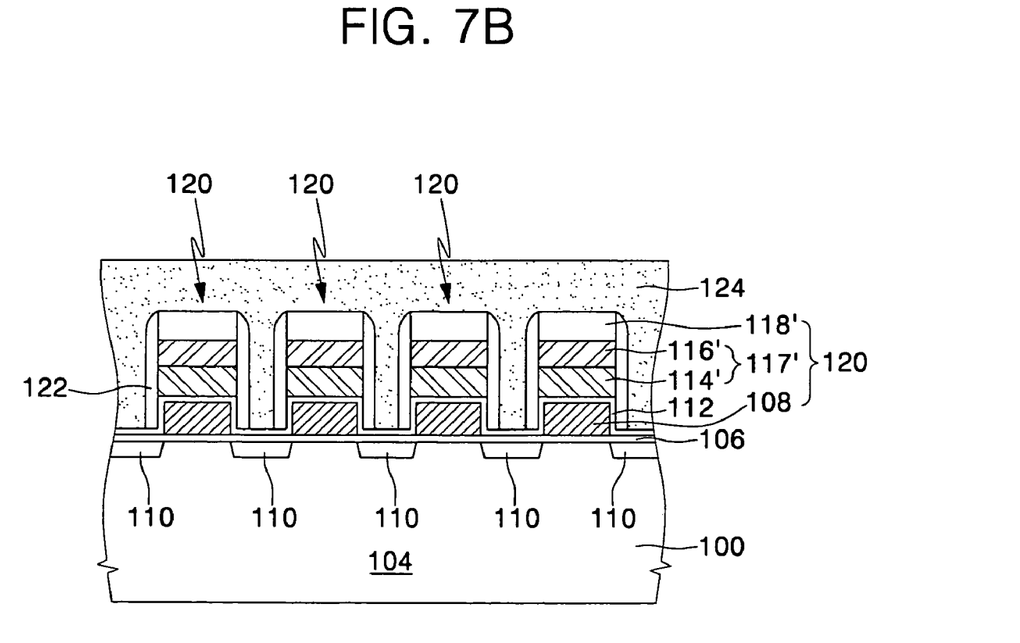

Referring to FIGS. 3, 7A, and 7B, spacers 122 are formed to cover the sidewalls of the word line patterns 120. To form the spacers 122, a silicon nitride layer may be conformally formed on the entire surface of the semiconductor substrate 100 and the word line patterns 120 and then anisotropically etched. An interlayer insulating layer 124 is formed on the entire surface of the semiconductor substrate 100 and the word line patterns 120 and the spacers 122. The inter-gate insulating layer 112 may remain under the interlayer insulating layer 124 between the word line patterns 120. The interlayer insulating layer 124 may be a planarized borophosphosilicate glass (BPSG) layer or a planarized undoped silicate glass (USG) layer.

A NAND type flash memory device according to some embodiments of the present invention will now be described with reference to FIGS. 3, 7A, and 7B.

Referring to FIGS. 3, 7A, and 7B, an isolation layer 102 is disposed in a semiconductor substrate 100 to define active regions 104. The active regions 104 may form parallel lines. A plurality of first conductive layer patterns 108 are disposed on the active regions 104. The first conductive layer patterns 108 are spaced apart from each other in a lengthwise direction of the active regions 104. The first conductive layer patterns 108 may be polysilicon layers and are provided as floating gate electrodes 108 of the NAND type flash memory device. As shown in FIG. 3, the floating gate electrodes 108 may each have a substantially square shape in the plan view. Accordingly, an upper surface of each of the floating gate electrodes 108 may have a substantially square shape. A tunnel insulating layer 106 is interposed between the floating gate electrodes 108 and the active regions 104. The tunnel insulating layer 106 may be a silicon oxide (SiO) layer, a silicon oxynitride (SiON) layer, and/or a high-k dielectric layer.

On the floating gate electrodes 108, second conductive layer patterns 117' cross the active regions 104 and the isolation layer 102 to overlap the floating gate electrodes 108. The second conductive layer patterns 117' may include second lower conductive layer patterns 114' and second upper conductive layer patterns 116' which are sequentially stacked and are provided as control gate electrodes 117' of the NAND type flash memory device. The second lower conductive layer patterns 114' may be formed of polysilicon, while the second upper conductive layer patterns 116' may be formed of metal silicide, such as tungsten silicide, cobalt silicide, and/or nickel silicide. Alternatively, the second upper conductive layer patterns 116' may be formed of metal, such as tungsten. Capping layer patterns 118' are disposed on the control gate electrodes 117'. The capping layer patterns 118' may be formed of SiN.

An inter-gate insulating layer 112 is interposed between the floating gate electrodes 108 and the control gate electrodes 117'. In some embodiments of the present invention, the inter-gate insulating layer 112 may be a high-k dielectric layer to reduce programming and erasing voltages by raising the CR of a unit cell. The high-k dielectric layer may be an aluminum oxide (AlO) layer, a hafnium oxide (HfO) layer, a hafnium silicon oxide (HfSiO) layer, a hafnium aluminum oxide (HfAlO) layer, a tantalum oxide (TaO) layer, and/or a zirconium oxide (ZrO) layer, or stack layers of two or more thereof. The inter-gate insulating layer 112 is interposed between the floating gate electrodes 108 and the control gate electrodes 117' and extends to cover at least the sidewalls of the floating gate electrodes 108. When the floating gate electrodes 108 have the shape of squares in the plan view as stated above, the inter-gate insulating layer 112 may cover all the four sidewalls of each of the floating gate electrodes 108. Further, the inter-gate insulating layer 112 may extend to cover the active regions 104 and the isolation layer 102 disposed between the control gate electrodes 117'. In contrast to conventional NAND type flash memory device, the inter-gate insulating layer 112 covers all the sidewalls of the floating gate electrodes 108 and also may remain on the active regions 104 and the isolation layer 102 disposed between the control gate electrodes 117' in accordance with some embodiments of the present invention.

The floating gate electrodes 108, the control gate electrodes 117', a portion of the inter-gate insulating layer 112 interposed between the floating gate electrodes 108 and the control gate electrodes 117', and the capping layer patterns 118' form word line patterns 120 of the NAND type flash memory device. Spacers 122 formed of SiN may be disposed on sidewalls of the word line patterns 120. Also, an interlayer insulating layer 124 is disposed on the entire surface of the semiconductor substrate 100 with the word line patterns 120 and the spacers 122. The interlayer insulating layer 124 may be a planarized BPSG layer or a planarized USG layer.

According to some embodiments of the present invention, as described above, a high-k dielectric layer may be used as an inter-gate insulating layer so that the CR of a unit cell of a flash memory device is increased. Because it may not be necessary to etch the high-k dielectric layer during the fabrication of the flash memory device, problems that may otherwise be caused by the etching process may be avoided.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, the method comprising:
    forming an isolation layer in a semiconductor substrate to define a plurality of parallel active regions in the semiconductor substrate;
    forming a plurality of first conductive layer patterns on the active regions, the first conductive layer patterns being spaced apart from each other in a lengthwise direction of the active regions and respectively including at least four sidewalls substantially perpendicular to the semiconductor substrate and an upper surface therebetween;
    conformally forming an insulating layer on the semiconductor substrate and on the at least four sidewalls and the upper surface therebetween of ones of the first conductive layer patterns;
    forming a second conductive layer on the insulating layer; and
    patterning the second conductive layer until the insulating layer is exposed to form a plurality of parallel second conductive layer patterns, the second conductive layer patterns crossing the active regions and the isolation layer to overlap the first conductive layer patterns.

2. The method according to claim 1, wherein the first conductive layer patterns comprise polysilicon.

3. The method according to claim 1, wherein forming a plurality of first conductive layer patterns on the active regions comprises forming the plurality of first conductive layer patterns to each have a substantially rectangular shape in a plan view.

4. The method according to claim 1, wherein conformally forming the insulating layer comprises forming the insulating layer on portions of the active regions between adjacent ones of the first conductive layer patterns to provide an etch stop layer, and wherein patterning the second conductive layer comprises etching the second conductive layer until the insulating layer on the portions of the active region is exposed.

5. The method according to claim 1, wherein the insulating layer comprises a high-k dielectric layer.

6. The method according to claim 5, wherein the high-k dielectric layer is formed of one selected from a group consisting of an aluminum oxide (AlO) layer, a hafnium oxide (HfO) layer, a hafnium silicon oxide (HfSiO) layer, a hafnium aluminum oxide (HfAlO) layer, a tantalum oxide (TaO) layer, and/or a zirconium oxide (ZrO) layer, and/or stack layers of two or more thereof.

7. The method according to claim 1, wherein the second conductive layer comprises a polysilicon layer.

8. The method according to claim 7, wherein forming a second conductive layer on the insulating layer comprises sequentially stacking a polysilicon layer and a metal silicide layer.

9. The method according to claim 1, further comprising forming source and drain regions by implanting impurity ions into the active regions using the first conductive layer patterns and the isolation layer as ion implantation masks after forming the first conductive layer patterns.

10. The method according to claim 1, further comprising forming an interlayer insulating layer to cover the second conductive layer patterns and portions of the insulating layer exposed by the second conductive layer patterns after forming the second conductive layer patterns.

11. A method of fabricating a NAND type flash memory device, the method comprising:
    forming an isolation layer in a semiconductor substrate to define a plurality of parallel active regions in the semiconductor substrate;
    forming a plurality of floating gate electrodes on the active regions, the floating gate electrodes being spaced apart from each other in a lengthwise direction of the active regions and respectively including at least four sidewalls substantially perpendicular to the semiconductor substrate and an upper surface therebetween;
    conformally forming an inter-gate insulating layer on the semiconductor substrate and on the at least four sidewalls and the upper surface therebetween of ones of the floating gate electrodes;
    forming a conductive layer on the inter-gate insulating layer; and
    patterning the conductive layer until the inter-gate insulating layer is exposed to form a plurality of parallel control gate electrodes, the control gate electrodes crossing the active regions and the isolation layer to overlap the floating gate electrodes.

12. The method according to claim 11, wherein the floating gate electrodes comprise polysilicon.

13. The method according to claim 11, wherein forming a plurality of floating gate electrodes on the active regions comprises forming the plurality of floating gate electrodes to each have a substantially rectangular shape in a plan view.

14. The method according to claim 11, wherein conformally forming the inter-gate insulating layer comprises forming the inter-gate insulating layer on portions of the active regions between adjacent ones of the floating gate electrodes to provide an etch stop layer, and wherein patterning the conductive layer comprises etching the conductive layer until the inter-gate insulating layer on the portions of the active region is exposed.

15. The method according to claim 11, wherein the inter-gate insulating layer comprises a high-k dielectric layer.

16. The method according to claim 15, wherein the high-k dielectric layer is formed of one selected from a group consisting of an aluminum oxide (ALO) layer, a hafnium oxide (HfO) layer, a hafnium silicon oxide (HfSiO) layer, a hafnium aluminum oxide (HfAlO) layer, a tantalum oxide (TaO) layer, and/or a zirconium oxide (ZrO) layer, and/or stacked layers of two or more thereof.

17. The method according to claim 11, wherein the conductive layer comprises a polysilicon layer.

18. The method according to claim 17, wherein forming a conductive layer on the inter-gate insulating layer comprises sequentially stacking a polysilicon layer and a metal silicide layer.

19. The method according to claim 11, further comprising forming source and drain regions by implanting impurity ions into the active regions using the floating gate electrodes and the isolation layer as ion implantation masks after forming the floating gate electrodes.

20. The method according to claim 11, further comprising forming an interlayer insulating layer to cover the control gate electrodes and portions of the inter-gate insulating layer exposed by the control gate electrodes after forming the control gate electrodes.

21. A semiconductor device comprising:
a semiconductor substrate;
an isolation layer on the semiconductor substrate to define a plurality of parallel active regions in the semiconductor substrate;
a plurality of first conductive layer patterns respectively including at least four sidewalls substantially perpendicular to the semiconductor substrate and an upper surface therebetween on the active regions and spaced apart from each other in a lengthwise direction of the active regions;
a plurality of parallel second conductive layer patterns crossing the active regions and the isolation layer to overlap the first conductive layer patterns; and
an insulating layer between the first conductive layer patterns and the second conductive layer patterns and extending on the at least four sidewalls and the upper surface therebetween of ones of the first conductive layer patterns.

22. The device according to claim 21, wherein the first conductive layer patterns comprise polysilicon layers.

23. The device according to claim 21, wherein the first conductive layer patterns are substantially rectangular shaped in a plan view.

24. The device according to claim 21, wherein the insulating layer comprises a high-k dielectric layer.

25. The device according to claim 24, wherein the high-k dielectric layer is one selected from a group consisting of an aluminum oxide (AlO) layer, a hafnium oxide (HfO) layer, a hafnium silicon oxide (HfSiO) layer, a hafnium aluminum oxide (HfAlO) layer, a tantalum oxide (TaO) layer, and/or a zirconium oxide (ZrO) layer, and/or stacked layers of two or more thereof.

26. The device according to claim 21, wherein the insulating layer further extends on portions of the active regions between adjacent ones of the first conductive layer patterns to provide an etch stop layer.

27. The device according to claim 21, wherein the second conductive layer patterns comprise polysilicon layers.

28. The device according to claim 21, further comprising an interlayer insulating layer on an entire surface of the semiconductor substrate, the first and second conductive layer patterns, and the insulating layer.

29. A NAND type flash memory device comprising:
a semiconductor substrate;
an isolation layer on the semiconductor substrate to define a plurality of parallel active regions in the semiconductor substrate;
a plurality of floating gate electrodes respectively including at least four sidewalls substantially perpendicular to the semiconductor substrate and an upper surface therebetween on the active regions and spaced apart from each other in a lengthwise direction of the active regions;
a plurality of parallel control gate electrodes crossing the active regions and the isolation layer to overlap the floating gate electrodes; and
an inter-gate insulating layer between the floating gate electrodes and the control gate electrodes and extending on the at least four sidewalls and the upper surface therebetween of ones of the floating gate electrodes.

30. The device according to claim 29, wherein the inter-gate insulating layer comprises a high-k dielectric layer.

31. The device according to claim 30, wherein the high-k dielectric layer is one selected from a group consisting of an aluminum oxide (AlO) layer, a hafnium oxide (HfO) layer, a hafnium silicon oxide (HfSiO) layer, a hafnium aluminum oxide (HfAlO) layer, a tantalum oxide (TaO) layer, and/or a zirconium oxide (ZrO) layer, and/or stacked layers of two or more thereof.

32. The device according to claim 29, wherein the inter-gate insulating layer further extends on portions of the active regions between adjacent ones of the floating gate electrodes to provide an etch stop layer.

* * * * *

UNITED STATES PATENT AND TRADEMARK OFFICE
CERTIFICATE OF CORRECTION

PATENT NO. : 7,338,849 B2  Page 1 of 1
APPLICATION NO. : 11/261820
DATED : March 4, 2008
INVENTOR(S) : Kim et al.

It is certified that error appears in the above-identified patent and that said Letters Patent is hereby corrected as shown below:

Column 11, Claim 16, Line 18: Please correct "(ALO)"
To read -- (AIO) --

Signed and Sealed this

Third Day of June, 2008

JON W. DUDAS
*Director of the United States Patent and Trademark Office*